US012745641B2

(12) United States Patent
Wang et al.

(10) Patent No.: US 12,745,641 B2
(45) Date of Patent: Sep. 22, 2026

(54) SEMICONDUCTOR DEVICES WITH DUMMY FILL STRUCTURES BETWEEN A THROUGH SILICON VIA AND AN ACTIVE DEVICE AND METHODS OF FORMING THE SAME

(71) Applicant: Taiwan Semiconductor Manufacturing Company, Ltd., Hsinchu (TW)

(72) Inventors: Mao-Nan Wang, Kaohsiung (TW); Chih Hsin Yang, Zhubei (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 470 days.

(21) Appl. No.: 18/457,282

(22) Filed: Aug. 28, 2023

(65) Prior Publication Data

US 2025/0079339 A1 Mar. 6, 2025

(51) Int. Cl.
*H10W 42/00* (2026.01)
*H10W 20/20* (2026.01)

(52) U.S. Cl.
CPC ............ *H10W 42/00* (2026.01); *H10W 20/20* (2026.01)

(58) Field of Classification Search
CPC . H01L 23/481; H01L 23/562; H01L 23/3212; H01L 21/76898; H01L 2225/06541; H01L 2225/06544; G06F 30/39; G06F 30/392; G06F 30/398; H10D 89/10; H10W 90/097; H10W 20/023; H10W 20/211
See application file for complete search history.

(56) References Cited

U.S. PATENT DOCUMENTS

2012/0295187 A1* 11/2012 Tsai ...................... H01L 23/528 716/55
2013/0001793 A1* 1/2013 Yu ..................... H01L 21/76898 257/774
2014/0287553 A1 9/2014 Lin et al.
2016/0225695 A1* 8/2016 Gandhi ............. H01L 21/76898
2019/0109119 A1 4/2019 Shih et al.
2022/0012402 A1* 1/2022 Hu ........................ G06F 30/392
2022/0013502 A1* 1/2022 Lee ..................... H01L 25/0652

* cited by examiner

*Primary Examiner* — Alia Sabur
(74) *Attorney, Agent, or Firm* — Ingrassia Fisher & Lorenz, LLP | IF&L

(57) ABSTRACT

Semiconductor devices having dummy regions with dummy fill structures that vary in lateral dimensions and methods for forming the semiconductor devices are provided herein. The semiconductor devices may include a through silicon via extending through a substrate of the semiconductor device, an active device in or on the substrate, and a dummy region of the substrate separating the through silicon via and the active device, the dummy region including dummy fill structures, wherein the dummy fill structures have lateral dimensions measured in a first direction from the through silicon via to the active device, wherein the lateral dimensions of the dummy fill structures varying in the first direction.

20 Claims, 6 Drawing Sheets

| Sample No. | PO-CD Condition | PO6 Topo Gap (nm) | PO6 Impact Distance (μm) |
|---|---|---|---|
| 1 | PO54-PO6 | 0.26 | 61.6 |
| 2 | PO84-PO135-PO6 | 1.67 | 62.3 |
| 3 | PO135-PO54-PO6 | 0.68 | 28.2 |
| 4 | PO200-PO36-PO135-PO54-PO6 | 1.65 | 41.2 |
| 5 | PO200-PO36-PO84-PO135-PO6 | 1.65 | 67.5 |

FIG. 6

SEMICONDUCTOR DEVICES WITH DUMMY FILL STRUCTURES BETWEEN A THROUGH SILICON VIA AND AN ACTIVE DEVICE AND METHODS OF FORMING THE SAME

BACKGROUND

The semiconductor integrated circuit (IC) industry has continued its rapid growth in recent years. Technological advancements in IC materials and design have led to continuous improvements in the generations of ICs. With each new generation, the circuits become smaller and more complex than their predecessors, resulting in higher functional density (i.e., the number of interconnected devices per chip area) and smaller geometric sizes (i.e., the smallest component or line that can be created using a fabrication process). This scaling down process has been beneficial in increasing production efficiency and reducing associated costs. However, as feature sizes continue to shrink, the manufacturing process becomes more challenging, and it becomes increasingly difficult to ensure the reliability of semiconductor devices. As a result, the industry faces the ongoing challenge of developing processes that can create smaller, more reliable ICs.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a table representing atomic force measurements obtained from various sample semiconductor devices during experimental investigations leading to certain aspects of an embodiment.

DETAILED DESCRIPTION

Figure 1:
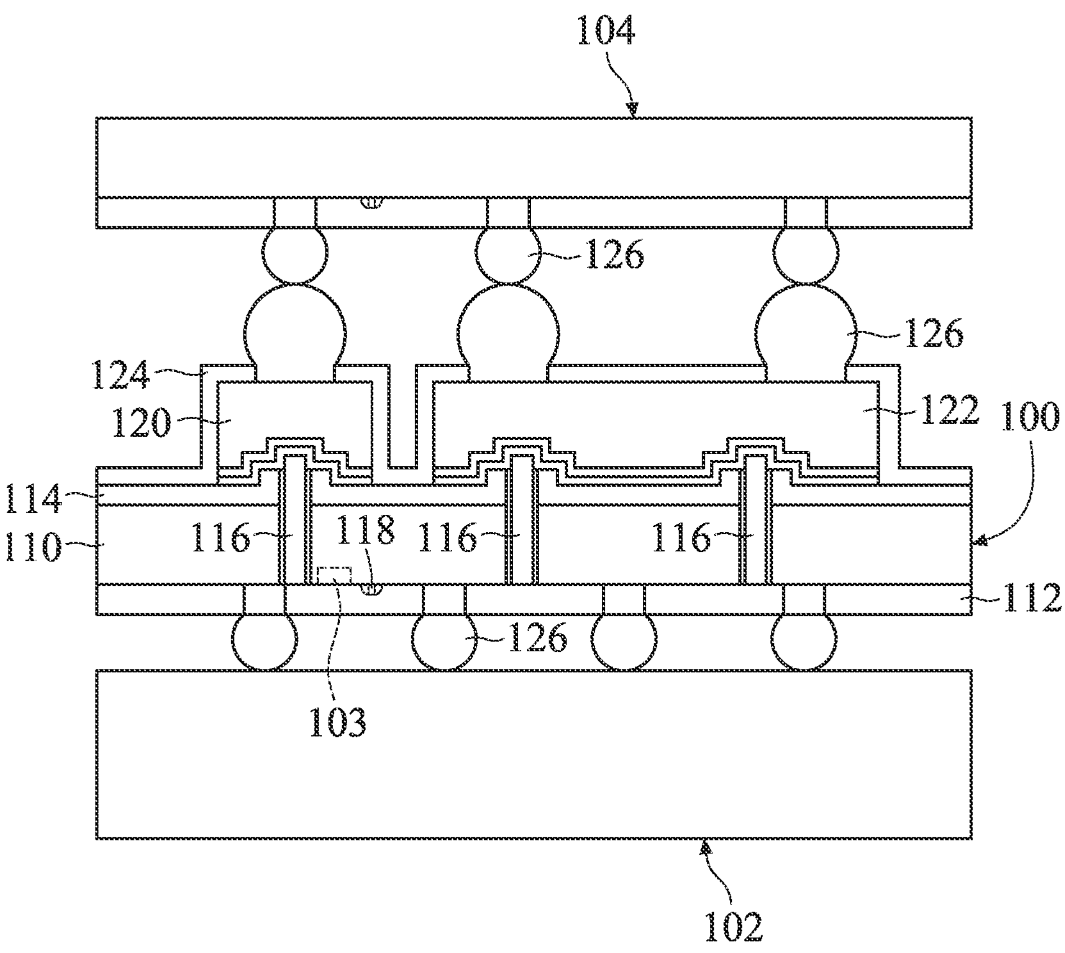
FIG. 1 schematically represents a cross-sectional view of a portion of a semiconductor device at one stage in an integrated circuit manufacturing process in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

Some embodiments of the disclosure will now be described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As used herein, a "layer" is a region, such as an area comprising arbitrary boundaries, and does not necessarily comprise a uniform thickness. For example, a layer can be a region comprising at least some variation in thickness.

Generally, through silicon vias (TSVs) may be formed in a semiconductor substrate in order to provide electrical connections to a backside of the semiconductor substrate. By providing such an electrical connection, the possibility of connecting the semiconductor substrate may be expanded beyond electrical connections located on only a single side of the semiconductor substrate as in previous generations of semiconductor processes. This expansion allows for, among other things, a three-dimensional stacking of semiconductor dies, with connections going through the TSVs and providing power, ground, and signal lines throughout the three-dimensional stack.

To form the TSVs, an opening may be formed on an active side of the semiconductor substrate, wherein the opening extends into the semiconductor substrate further than active devices located in or on the semiconductor substrate. These openings may then be filled with a conductive material. After the openings have been filled, the backside of the semiconductor substrate may be thinned through, e.g., a chemical mechanical polishing (CMP) or etching process in order to expose the conductive material, thereby leaving a planar surface between the conductive material and the surrounding materials. A conductive glue layer may then be formed over the planar surface in order to provide an interface between the TSV and a contact to be formed.

TSVs are typically surrounded by relatively large structure-free areas (e.g., poly empty region) formed of a non-conductive material. During CMP operations associated with forming the TSV, excessive thinning (i.e., dishing) may occur. Therefore, it is generally necessary to provide sufficient distance between the TSV and any neighboring active devices to reduce the adverse impact of the dishing on the active devices such as reducing gate heights thereof.

Presented herein are embodiments of semiconductor structures and of methods for forming semiconductor structures with dummy regions, that is, non-functional areas, located between TSVs and neighboring active devices. The dummy regions include dummy fill structures, that is, non-functional structures, that are configured to reduce dishing during planarization and thereby allow for smaller dummy regions and improved topography control. For convenience, the semiconductor structures and methods will be described herein in reference to planarization during formation of TSVs. However, the semiconductor structures and methods are not limited to this application and/or stage of the IC production process.

The dummy region provides isolation and reduces the likelihood of electrical interactions or crosstalk between the TSV and adjacent circuitry or active devices. The dummy region may include a non-conductive material, such as silicon dioxide ($SiO_2$), that functions as an insulator. The dummy region may also include additional layers or structures that enhance electrical isolation, reduce noise, or provide mechanical stability. In addition, the dummy region may be configured to provide sufficient spacing between the TSV and a nearby active device such that the active device is not substantially impacted (e.g., significantly reduced gate height) during planarization of the TSV region.

In various embodiments, the dummy fill structures of the dummy regions are formed of materials that have little to no thinning relative to the surrounding insulation material (e.g., non-conductive materials such as $SiO_2$) during planarization. For example, the dummy fill structures may be formed of materials (e.g., metallic materials) that are not etched by the etchant used during planarization of the TSV region. The dummy fill structures may include the same or different materials. In the examples described herein, the dummy region includes a pattern of the dummy fill structures arranged in a manner such that the lateral dimensions of the dummy fill structures vary or are different laterally across the dummy region between the TSV and the active device. In some embodiments, the lateral dimensions of the dummy fill structures define a lateral dimension gradient that decreases from a maximum lateral dimension to a minimum lateral dimension in a direction from the TSV toward the active device.

FIG. 1 is a cross-sectional view of a portion of an example semiconductor device 100 at one stage in an integrated circuit manufacturing process in accordance with an embodiment. Shown is a portion of the semiconductor device 100 having electrical circuitry formed in and/or upon a substrate 110. The substrate 110 may be one of a variety of types of semiconductor substrates commonly employed in semiconductor integrated circuit fabrication, and integrated circuits may be formed therein and/or thereupon. The substrate 110 may be of any construction comprising semiconductor materials, including but not limited to, bulk silicon, a semiconductor wafer, a silicon-on-insulator (SOI) substrate, or a silicon germanium substrate. Other semiconductor materials, including group III, group IV, and/or group V semiconductors, can be used.

The semiconductor device 100 includes one or more metallization layers 112 on a first side of the substrate 110, one or more first passivation layers 114 on a second side of the substrate 110, TSVs 116 formed in and extending through the substrate 110, at least one active device 118 formed in or one the substrate 110, a contact pad 120 and a redistribution layer 122 formed on the passivation layer(s) 114 and in electrical contact with the TSVs 116, and one or more second passivation layers 124 formed on the contact pad 120 and the redistribution layer 122. Conductive bumps 126 connect the semiconductor device 100 to a first external device 102 on the first side thereof and to a second external device 104 on the second side thereof. A dummy region 103 is located between a first of the TSVs 116 and the active device 118.

In some embodiments, the substrate 110 can include a plurality of functional regions. The plurality of functional regions can be defined and electrically isolated from each other by isolation features, such as shallow trench isolations (STis) features or local oxidation of silicon (LOCOS) features, but the disclosure is not limited thereto. Various electrical components may be formed over the substrate 110 within the functional regions. Examples of the electrical components include active devices (e.g., the active device 118), such as transistors and diodes, and passive devices, such as capacitors, inductors, and resistors. As shown in FIG. 1, in some embodiments, active devices, i.e., transistors, can be formed over the substrate 110. The functional regions isolated by isolation features may include microelectronic elements formed in and/or upon the substrate 110. Examples of the types of microelectronic elements that may be formed in the substrate 110 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other suitable elements. Various processes are performed to form the various microelectronic elements, including but not limited to one or more of deposition, etching, implantation, photolithography, annealing, and other suitable processes. The microelectronic elements are interconnected to form the integrated circuit device, which may comprise one or more of a logic device, memory device (e.g., SRAM), radio frequency (RF) device, input/output (I/O) device, system-on-chip (SoC) device, and other suitable types of devices.

Figure 2:
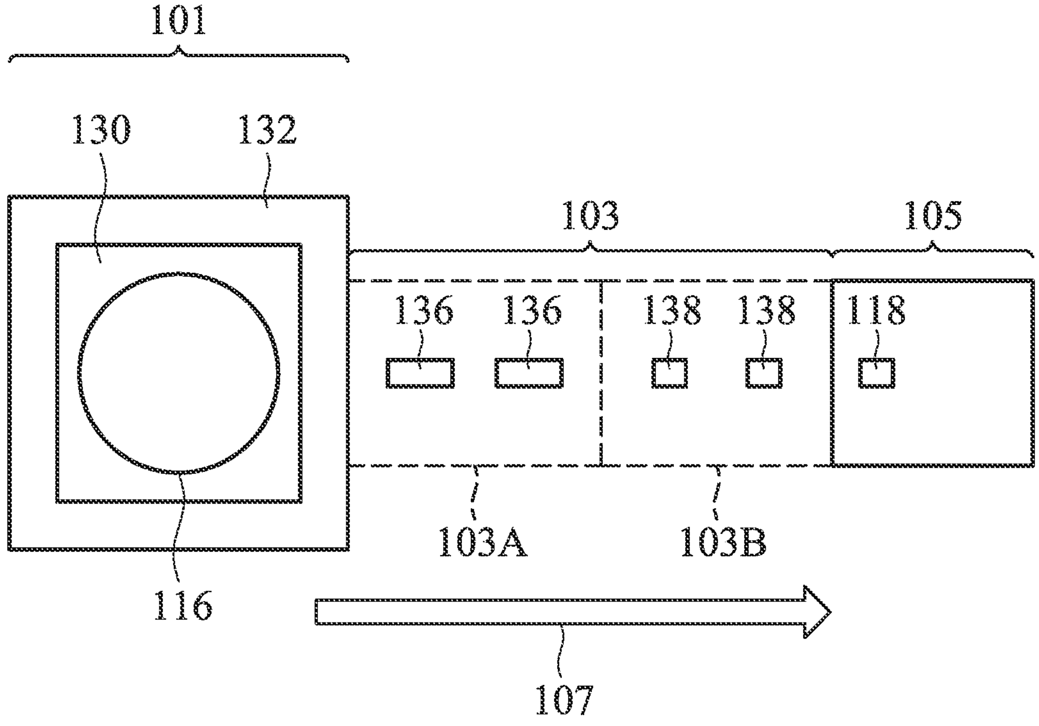
FIG. 2 schematically represents a top view of a portion of a semiconductor device that includes a through silicon via (TSV) region, an active device region, and a dummy region therebetween in accordance with some embodiments.

Referring to FIG. 2, a top view is provided representing of a portion of the first side of the semiconductor device 100 that includes a through silicon via (TSV) region 101, a functional region 105, and the dummy region 103 therebetween in accordance with some embodiments. In this example, the TSV region 101 includes the first TSV 116 surrounded by a structure-free area 130 (e.g., a poly empty region) which is further surrounded by a barrier (e.g., TSV GRW) that includes stress-relief structures 132 configured to contain stresses resulting from formation and presence of the first TSV 116. In some embodiments, the stress-relief structures 132 may include metallic materials such as, but not limited to, copper or alloys thereof. The functional region 105 includes the active device 118.

The dummy region 103 includes first and second dummy fill (i.e., non-functional) structures 136 and 138 formed of materials that are resistant to removal during planarization of the TSV region 101, that is, having little or no reaction to an etchant used to during the planarization that is configured to, for example, etching polysilicon or other surrounding materials (e.g., non-conductive materials such as $SiO_2$). In some embodiments, the first and second dummy fill structures 136 and 138 may be formed of a metallic material such as, but not limited to, copper or an alloy thereof. The first and second dummy fill structures 136 and 138 of the dummy region 103 define a pattern wherein lateral dimensions of the first and second dummy fill structures 136 and 138 vary, that is, are different from each other, laterally across the dummy region 103 between the TSV region 101 and the functional region 105. In some examples, the first and second dummy fill structures 136 and 138 may have lateral dimensions of about 200 nanometers (nm) or less. In some embodiments, the lateral dimensions of the first and second dummy fill structures 136 and 138 decrease from a maximum lateral dimension to a minimum lateral dimension in a direction (e.g., direction 107 in FIG. 2) from the TSV region 101 toward the functional region 105. For example, the lateral dimensions of the first and second dummy fill structures 136 and 138 may decrease from about 200 nm to 6 nm, such as about 135 nm to about 6 nm, such as about 54 nm to about 6 nm. In some embodiments, the lateral dimensions of the first and second dummy fill structures 136 and 138 may decrease in a step manner such as 200 nm to 135 nm to 54 nm, such as 135 nm to 54 nm to 6 nm, etc. For example, in FIG. 2 the dummy region 103 is segmented into first and second subregions or sections 103A and 103B. In this example, the first dummy fill structures 136 of the first section 103A may have a first lateral dimension (e.g., 135 nm) or a first range of lateral dimensions (e.g., 100 nm to 150 nm) and the second dummy fill structures 138 of the second section 103B may have a second lateral dimension (e.g., 54 nm) or second range of lateral dimensions (e.g., 6 nm to 75 nm) that are less than the first lateral dimension and/or the first range of lateral dimensions. Although the portion of the semiconductor device 100 presented in FIG. 2 includes only two of the first dummy fill structures 136 and two of the second dummy fill structures 138, it should be understood that the dummy region may have fewer or more of the first and second dummy fill structures 136 and 138, and/or may include any number of additional dummy fill structures having other lateral dimensions.

Figure 3:
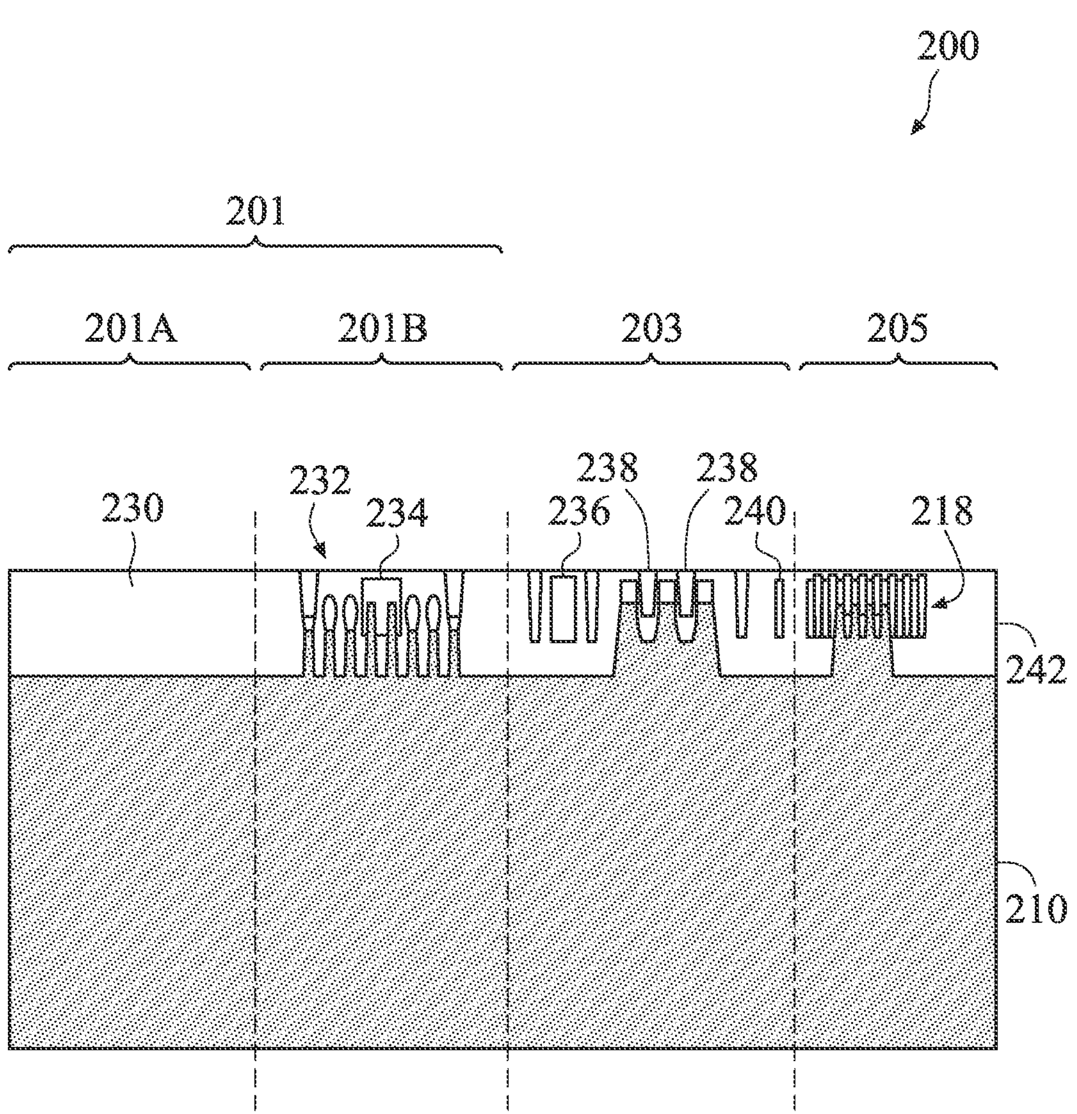
FIG. 3 schematically represents a cross-sectional view of a portion of a semiconductor device that includes a through silicon via (TSV) region, an active device region, and a dummy region therebetween in accordance with some embodiments.

Referring now to FIG. 3, a cross-sectional view is presented representing a portion 200 of a substrate 210 of another exemplary semiconductor device having one or more outermost layers 242 (e.g., dielectric layer(s); e.g., polysilicon). The portion 200 includes a through silicon via (TSV) region 201, a functional region 205, and a dummy region 203 therebetween in accordance with some embodiments. The TSV region 201 is segmented into a structure-free section 201A that includes a TSV (not shown or not yet formed) and a stress-relief region 201B. The structure-free section 201A includes a structure-free area 230 (e.g., poly empty region) and the stress-relief region 201B includes stress-relief structures 232. The functional region 205 includes an active device 218. In this example, the dummy region 203 includes first, second, and third dummy fill structures 236, 238, and 240 each having different lateral dimensions that decrease in the direction from the TSV region 201 to the functional region 205. As such, the first dummy fill structure 236 may have a first lateral dimension, the second dummy fill structures 238 may have a second lateral dimension that is less than the first lateral dimension, and the third dummy fill structure 240 may have a third lateral dimension that is less than the second lateral dimension. In addition, in this example the stress-relief structures 232 include a structure 234 that has a fourth lateral dimension that is greater than the first lateral dimension of the first dummy fill structure 236.

Figure 4:
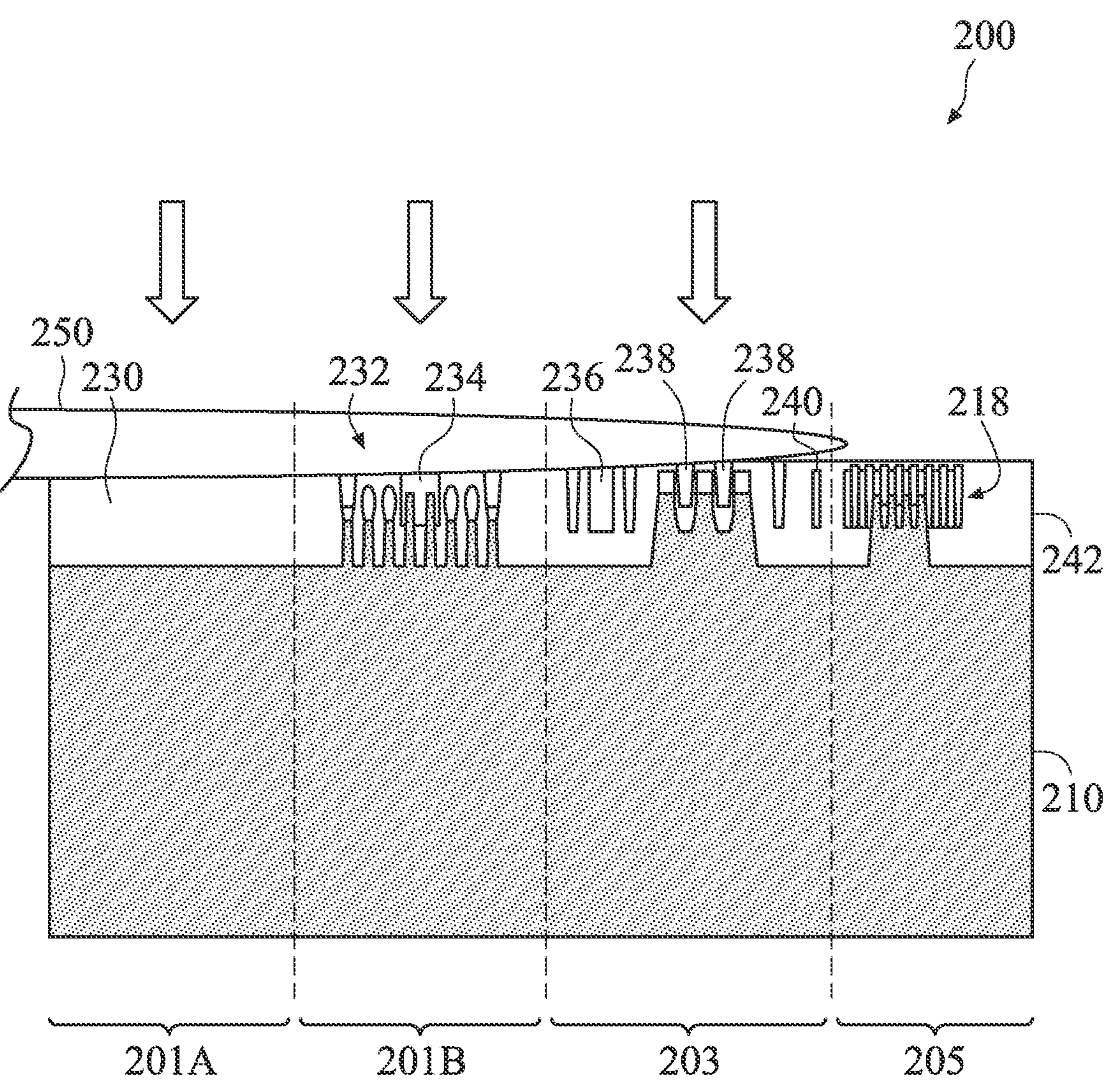
FIG. 4 schematically represents a cross-sectional view of the portion of the semiconductor device of FIG. 3 and illustrates chemical metal polishing of the semiconductor device in accordance with some embodiments.

FIG. 4 illustrates performing a CMP process on the semiconductor of FIG. 3 which is intended to show certain benefits of the inclusion of the dummy fill structures 236, 238, and 240. An area being reduced in height, that is, thinned, by the CMP process is represented by an oval shape 250. As represented, the active device 218 is not thinned by the CMP process. In particular, the dummy fill structures 236, 238, and 240 function to reduce the dishing caused by the CMP process and thereby protect the active device 218.

Figure 5:
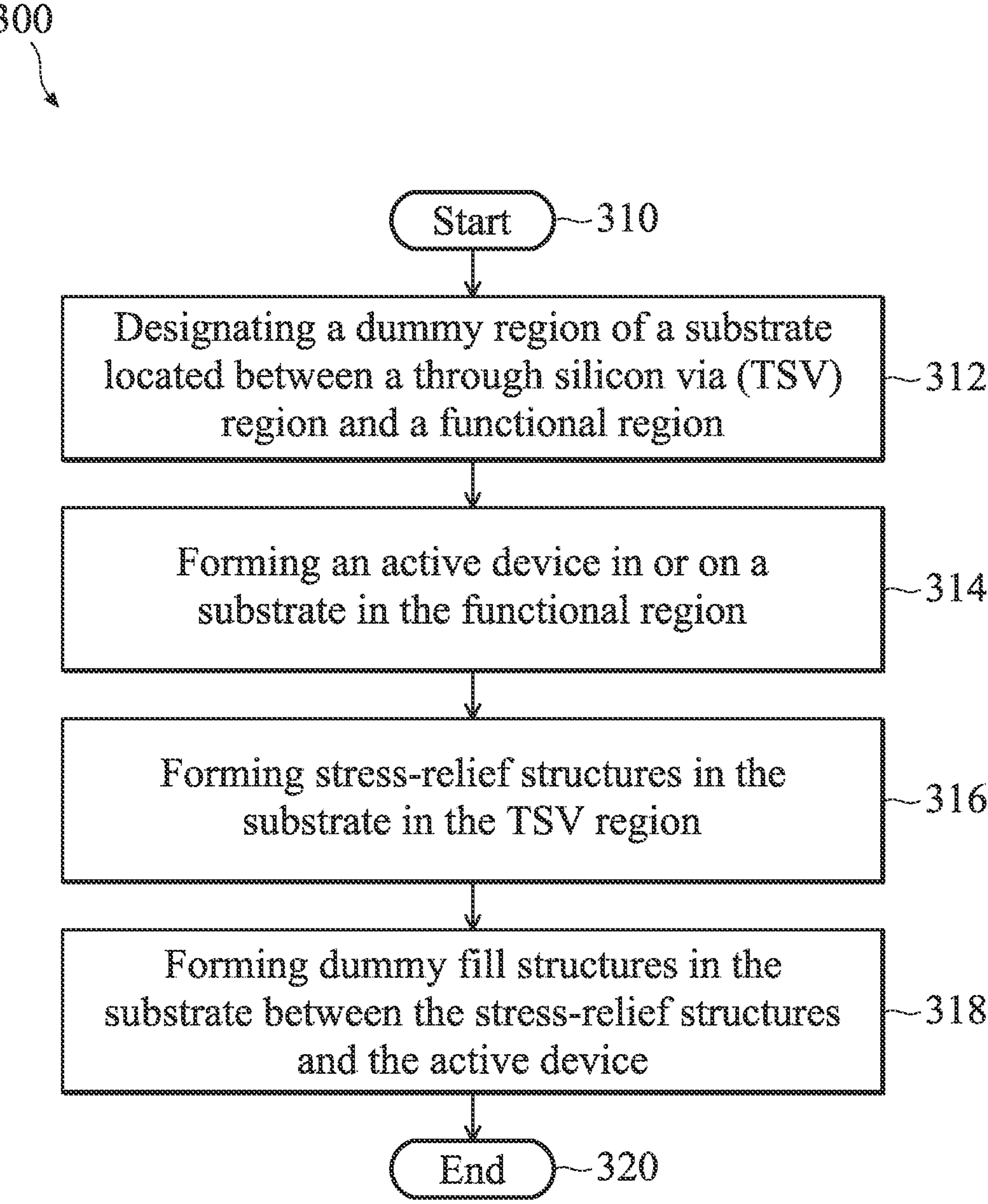
FIG. 5 is a flowchart illustrating an exemplary method for forming a semiconductor device in accordance with some embodiments.

Referring to FIG. 5, an exemplary method 300 is presented for forming a semiconductor structure. In some embodiments, the method 300 may be used to form the portion of semiconductor device 100 represented in FIG. 2 and/or the portion 200 of the semiconductor device represented in FIG. 3. The method 300 may start at 310. At 312, the method 300 includes designating a dummy region of a substrate of a semiconductor device that is located between a TSV region and a functional region.

At 314, the method 300 includes forming one or more active devices in and/or on the substrate within the functional region. Various processes may be performed to form the active device(s), including but not limited to one or more of deposition, etching, implantation, photolithography, annealing, and other suitable processes. In alternative embodiments, the substrate may be provided with the active device(s) already formed.

At 316, the method 300 includes forming one or more stress-relief structures in the substrate within the TSV region. Various processes may be performed to form the stress-relief structure(s), including but not limited to one or more of deposition, etching, implantation, photolithography, annealing, and other suitable processes. In alternative embodiments, the substrate may be provided with the stress-relief structure(s) already formed.

At 318, the method 300 includes forming dummy fill structures in the substrate within the dummy region between the stress-relief structure(s) and the active device(s). The dummy fill structures may be formed having varying or different lateral dimensions measured in a first direction from the TSV region and the functional region. In some embodiments, the dummy fill structures may be formed to define a lateral dimension gradient that decreases in the first direction from a maximum lateral dimension to a minimum lateral dimension.

In some embodiments, the dummy fill structures may be formed by initially forming openings in a surface of the substrate or a layer thereon within the dummy region. In some embodiments, each of the openings may have a lateral dimension in the first direction that corresponds to the maximum lateral dimension of the dummy fill structures, the minimum lateral dimension of the dummy fill structures, or another lateral dimension therebetween. In some embodiments, the gradient may be defined by at least two contiguous sections of the dummy region, a first of the contiguous sections including a first set of the dummy fill structures having the maximum lateral dimension and a second of the contiguous sections includes a second set of the dummy fill structures having the minimum lateral dimension. The openings may be filled with one or more fill materials to form one or more fill layers within the openings to define the dummy fill structures. The one or more fill materials may include materials that have little to no reaction with an etchant subsequently used to planarize the TSV region. In some embodiments, the fill materials may include a metallic material such as, but not limited to, copper or an alloy thereof.

In some embodiments, the method 300 may include forming the TSV in the TSV region subsequent to forming the dummy fill structures in the dummy region. Various processes may be performed to form the TSV, including but not limited to one or more of deposition, etching, implantation, photolithography, annealing, and other suitable processes. Formation of the TSV may include performing one or more CMP processes on the TSV region. The one or more CMP processes may include placing the semiconductor device in a carrier that presses the surface to be polished (i.e., the TSV region) against a polishing pad attached to a platen. The platen and the carrier may be counter-rotated while a CMP slurry containing both abrasive particles and reactive chemicals (e.g., etchants) are applied to the polishing pad. The CMP slurry is transported to the surface of the semiconductor device via the rotation of the polishing pad. The relative movement of the polishing pad and the surface coupled with the reactive chemicals in the CMP slurry allows CMP to level the TSV region by means of both physical and chemical actions that remove materials that react with the reactive chemicals, such as polysilicon.

The method 300 may end at 320.

As mentioned above, dishing may occur during the CMP process(es). According to the method 300, the dummy region includes the dummy fill structures that have little or no reaction with the reactive chemicals (e.g., etchants) used during the CMP process(es) and therefore are significantly more resistant to thinning during the CMP process(es). The inclusion of the dummy fill structures may limit the overall dishing and thereby reduce or eliminate any adverse impact on the active device(s) within the functional region resulting from the CMP process(es). Accordingly, a total lateral dimension of the dummy region may be reduced allowing for more compact surface designs of semiconductor devices.

In experimental investigations leading to certain aspects of some of the embodiments described herein, sample devices were prepared having a TSV region, a functional region, and a dummy region therebetween that included dummy fill structures having various patterns of lateral dimensions. CMP processes were performed on the sample devices to determine an effectiveness of the various patterns in reducing dishing within the dummy regions and thereby reducing the impact of the CMP processes on the functional regions thereof (e.g., reduced gate heights). For example, FIG. 6 includes a table describing patterns and test results for five sample devices. The dummy fill structures were formed of polysilicon (PO) had lateral dimensions measured in a direction from the TSV region to the functional region.

A first sample device (sample no. 1) included two sets of dummy fill structures having lateral dimensions in the first direction of 54 nm and 6 nm. A second sample device (sample no. 2) included three sets of dummy fill structures having lateral dimensions in the first direction of 84 nm, 135 nm, and 6 nm. A third sample device (sample no. 3) included three sets of dummy fill structures having lateral dimensions in the first direction of 135 nm, 54 nm, and 6 nm. A fourth sample device (sample no. 4) included five sets of dummy fill structures having lateral dimensions in the first direction of 200 nm, 36 nm, 135 nm, 54 nm, and 6 nm. A fifth sample device (sample no. 5) included five sets of dummy fill structures having lateral dimensions in the first direction of 200 nm, 36 nm, 84 nm 135 nm, and 6 nm.

The table of FIG. 6 shows the topological gap (e.g., height change in the first direction) across the dummy region subsequent to the CMP process in nanometers (nm), and the impact distance (e.g., noticeable dishing) from the TSV region subsequent to the CMP process in micrometers (μm). As shown, the first sample device had a smallest topological gap (i.e., 0.26 nm) and the third sample device had the smallest impact distance (i.e., 28.2 μm). These results indicated that a decreasing lateral dimension gradient (e.g., sample nos. 1 and 3) produced superior results relative to varying lateral dimensions (e.g., sample nos. 2, 4, and 5).

The present disclosure therefore provides semiconductor devices having dummy regions with dummy fill structures that vary in lateral dimensions and methods for forming the semiconductor devices.

In accordance with an embodiment, a semiconductor device is provided that includes a through silicon via extending through a substrate of the semiconductor device, an active device in or on the substrate, and a dummy region of the substrate separating the through silicon via and the active device, the dummy region including dummy fill structures, wherein the dummy fill structures have lateral dimensions measured in a first direction from the through silicon via to the active device, wherein the lateral dimensions of the dummy fill structures varying in the first direction.

In accordance with another embodiment, a method is provided for forming a semiconductor device. The method includes designating a dummy region of a substrate located between a through silicon via (TSV) region of the substrate configured to include a through silicon via extending through the substrate and a functional region of the substrate configured to include an active device in or on the substrate, and forming dummy fill structures within the dummy region that have lateral dimensions measured in a first direction from the TSV region and the functional region, wherein the lateral dimensions of the dummy fill structures define a gradient between the TSV region and the functional region that decreases in the first direction from a maximum lateral dimension to a minimum lateral dimension.

In accordance with yet another embodiment, a method is provided for forming a semiconductor device. The method includes forming an active device in or on a substrate of the semiconductor device, forming stress-relief structures in the substrate configured to surround a through silicon via, and forming dummy fill structures between the stress-relief structures and the active device, wherein the stress-relief structures have first lateral dimensions measured in a first direction from the stress-relief structures to the active device, the dummy fill structures have second lateral dimensions measured in the first direction, and the first lateral dimensions of the stress-relief structures are greater than the second lateral dimensions of the dummy fill structures, wherein the second lateral dimensions of the dummy fill structures define a lateral dimension gradient between the stress-relief structures and the active device that decreases in the first direction from a maximum lateral dimension to a minimum lateral dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:

a through silicon via (TSV) extending through a substrate of the semiconductor device;

an active device in or on the substrate; and a dummy region of the substrate separating the TSV and the active device, the dummy region including a plurality of dummy fill structures, wherein the dummy fill structures have a lateral dimension measured in a first direction from the TSV to the active device, wherein the lateral dimension of a first dummy fill structure is different from the lateral dimension of a second dummy fill structure in the dummy region, wherein the lateral dimensions of the dummy fill structures define a lateral dimension gradient between the TSV and the active device that decreases in the first direction from a maximum lateral dimension to a minimum lateral dimension.

2. The semiconductor device of claim 1, wherein the maximum lateral dimension is within a range of 50 to 200 nm and the minimum lateral dimension is within a range of 50 nm or less.

3. The semiconductor device of claim 1, wherein the maximum lateral dimension is within a range of 100 to 150 nm and the minimum lateral dimension is within a range of 6 to 75 nm.

4. The semiconductor device of claim 1, wherein the lateral dimension gradient is defined by at least two contiguous sections of the dummy region, a first of the contiguous sections including a first set of the dummy fill structures having the maximum lateral dimension and a second of the contiguous sections includes a second set of the dummy fill structures having the minimum lateral dimension.

5. The semiconductor device of claim 1, wherein the maximum lateral dimension is within a range of 100 to 150 nm and the minimum lateral dimension is within a range of 6 to 75 nm.

6. The semiconductor device of claim 1, wherein at least some of the dummy fill structures include a metallic material.

7. The semiconductor device of claim 1, further comprising stress-relief structures in the substrate surrounding the through silicon via, wherein the stress-relief structures have second lateral dimensions in the first direction that are greater than the lateral dimensions of the dummy fill structures.

8. A method for forming a semiconductor device, comprising:

designating a dummy region of a substrate located between a through silicon via (TSV) region of the substrate configured to include a through silicon via extending through the substrate and a functional region of the substrate configured to include an active device in or on the substrate; and forming dummy fill structures within the dummy region that have lateral dimensions measured in a first direction from the TSV region to the functional region, wherein the lateral dimensions of the dummy fill structures define a gradient between the TSV region and the functional region that decreases in the first direction from a maximum lateral dimension to a minimum lateral dimension.

9. The method of claim 8, wherein the maximum lateral dimension is within a range of 50 to 200 nm and the minimum lateral dimension is within a range of 50 nm or less.

10. The method of claim 8, wherein the gradient is defined by at least two contiguous sections of the dummy region, a first of the contiguous sections including a first set of the dummy fill structures having the maximum lateral dimension and a second of the contiguous sections includes a second set of the dummy fill structures having the minimum lateral dimension.

11. The method of claim 8, wherein forming the dummy fill structures comprises:

forming openings in a surface of the substrate within the dummy region, wherein each of the openings have a third lateral dimension in the first direction that is the maximum lateral dimension, the minimum lateral dimension, or another lateral dimension therebetween; and filling the openings with one or more fill materials to form one or more fill layers within the openings to define the dummy fill structures, wherein the one or more fill materials have a hardness that is greater than a hardness of materials surrounding the dummy fill structures within the dummy region.

12. The method of claim 8, wherein the dummy region has a lateral dimension in the first direction of 100 micrometers or less.

13. The method of claim 8, wherein the dummy region has a lateral dimension in the first direction of 50 micrometers or less.

14. The method of claim 8, wherein the TSV region includes stress-relief structures that are configured to surround a through silicon via, wherein the stress-relief structures have second lateral dimensions in the first direction that are greater than the lateral dimensions of the dummy fill structures.

15. A method for forming a semiconductor device, comprising:

forming an active device in or on a substrate of the semiconductor device;

forming stress-relief structures in the substrate configured to surround a through silicon via; and forming dummy fill structures between the stress-relief structures and the active device, wherein the stress-relief structures have first lateral dimensions measured in a first direction from the stress-relief structures to the active device, the dummy fill structures have second lateral dimensions measured in the first direction, and the first lateral dimensions of the stress-relief structures are greater than the second lateral dimensions of the dummy fill structures, wherein the second lateral dimensions of the dummy fill structures define a lateral dimension gradient between the stress-relief structures and the active device that decreases in the first direction from a maximum lateral dimension to a minimum lateral dimension.

16. The method of claim 15, wherein the maximum lateral dimension is within a range of 50 to 200 nm and the minimum lateral dimension is within a range of 50 nm or less.

17. The method of claim 15, wherein the maximum lateral dimension is within a range of 100 to 150 nm and the minimum lateral dimension is within a range of 6 to 75 nm.

18. The method of claim 15, wherein the lateral dimension gradient is defined by at least two contiguous sections of the substrate, a first of the contiguous sections including a first set of the dummy fill structures having the maximum lateral dimension and a second of the contiguous sections including a second set of the dummy fill structures having the minimum lateral dimension.

19. The method of claim 15, wherein the stress-relief structures and the active device are separated by a third lateral dimension in the first direction of 100 micrometers or less.

20. The method of claim 15, wherein at least some of the dummy fill structures include a metallic material.

* * * * *